(12) United States Patent
Hachiya

(10) Patent No.: US 9,873,394 B2
(45) Date of Patent: Jan. 23, 2018

(54) ELECTRICAL CONNECTION BOX

(71) Applicants: Sumitomo Wiring Systems, Ltd, Yokkaichi, Mie (JP); AutoNetworks Technologies, Ltd., Yokkaichi, Mie (JP); Sumitomo Electric Industries, Ltd., Osaka (JP)

(72) Inventor: Yoshikazu Hachiya, Mie (JP)

(73) Assignees: Sumitomo Wiring Systems, Ltd., Yokkaichi, Mie (JP); AutoNetworks Technologies, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 15/034,446

(22) PCT Filed: Oct. 15, 2014

(86) PCT No.: PCT/JP2014/077433
§ 371 (c)(1),
(2) Date: May 4, 2016

(87) PCT Pub. No.: WO2015/068544
PCT Pub. Date: May 14, 2015

(65) Prior Publication Data
US 2016/0272132 A1 Sep. 22, 2016

(30) Foreign Application Priority Data
Nov. 5, 2013 (JP) .................................. 2013-229217

(51) Int. Cl.
*H01R 13/46* (2006.01)
*B60R 16/03* (2006.01)
(Continued)

(52) U.S. Cl.
CPC ............. *B60R 16/03* (2013.01); *H02G 3/081* (2013.01); *H02G 3/088* (2013.01);
(Continued)

(58) Field of Classification Search
CPC .... H05K 3/107; H05K 1/0256; H05K 3/4626; H02G 3/081; H02G 3/088; B60R 16/03
(Continued)

(56) References Cited

U.S. PATENT DOCUMENTS 5,207,591 A * 5/1993 Ozaki ..................... B60R 16/02
439/212
5,396,027 A * 3/1995 Zemen, Jr. ............. H01R 25/00
174/494
(Continued)

FOREIGN PATENT DOCUMENTS

EP 0605842 A1 7/1994
EP 1215087 A2 6/2002
JP 2012165590 A 8/2012

OTHER PUBLICATIONS

European Search Report for PCT/JP2014071433 dated Nov. 18, 2016.

*Primary Examiner* — Steven T Sawyer
(74) *Attorney, Agent, or Firm* — Dinsmore & Shohl LLP

(57) ABSTRACT

Provided is an electrical junction box having a novel structure capable of preventing vehicle fire after the infiltration of water without depending on a waterproofing structure of the electrical junction box. An electrical junction box includes a bus bar circuit unit obtained by arranging a plurality of bus bars including a power source-side bus bar to be connected to a power source line and a ground-side bus bar to be connected to a ground line on insulated boards. In the electrical junction box, the power source-side bus bar and the ground-side bus bar are arranged adjacent to each other, and an oxide deposition inhibiting structure is provided in
(Continued)

exposed portions of the insulated board exposed through a gap between the power source-side bus bar and the ground-side bus bar.

5 Claims, 4 Drawing Sheets

(51) Int. Cl.
    *H05K 1/02*     (2006.01)
    *H02G 3/08*     (2006.01)
    *B60R 16/023*     (2006.01)
    *H05K 3/10*     (2006.01)
    *H05K 3/24*     (2006.01)
    *H05K 3/46*     (2006.01)

(52) U.S. Cl.
    CPC ......... *H05K 1/0256* (2013.01); *H05K 3/4626* (2013.01); *B60R 16/0239* (2013.01); *H05K 1/0265* (2013.01); *H05K 3/103* (2013.01); *H05K 3/24* (2013.01); *H05K 3/4617* (2013.01); *H05K 2201/09063* (2013.01); *H05K 2201/09945* (2013.01); *H05K 2201/10272* (2013.01)

(58) Field of Classification Search
    USPC .......................................... 174/520; 439/76.2
    See application file for complete search history.

(56) References Cited

U.S. PATENT DOCUMENTS

| | | |
|---|---|---|
| 7,532,458 B2 | 5/2009 | Sasaki et al. |
| 2006/0292903 A1 | 12/2006 | Kanou |
| 2007/0086152 A1 | 4/2007 | Sasaki et al. |
| 2012/0199373 A1* | 8/2012 | Uchida ............... B60R 16/0238 174/50 |

* cited by examiner

ELECTRICAL CONNECTION BOX

CROSS-REFERENCE TO RELATED APPLICATIONS

This application is the U.S. national stage of PCT/JP2014/077433 filed Oct. 15, 2014, which claims priority of Japanese Patent Application No. JP2013-229217 filed Nov. 5, 2013.

FIELD OF THE INVENTION

The present invention relates to an electrical junction box to be mounted in a vehicle such as an automobile, and particularly to an electrical junction box provided with a structure for preventing a fire from breaking out after the infiltration of water.

BACKGROUND OF THE INVENTION

Conventionally, electrical junction boxes are provided at appropriate positions in electrical systems of automobiles and the like, and thus power is distributed from a battery to various loads with good space efficiency. Specifically, a bus bar circuit unit in which a power source-side bus bar connected to a power source line such as a battery and a ground-side bus bar connected to a ground line are arranged on an insulated board is accommodated in the electrical junction box, and thus power is distributed.

If water infiltrates such an electrical junction box, there is a risk that a short circuit or the like occurs in the bus bar circuit unit. Therefore, certain waterproofing measures are taken for the electrical junction box in consideration of a water splashing that is assumed to occur during use of the vehicle. As mentioned in Japanese Patent No. 4585980 (Patent Document 1), a measure in which gaps of the case of the electrical junction box are sealed with a sealing material or the like, and a measure in which a drainage slope is provided at an appropriate position in the case to facilitate the drainage of water that infiltrated the case are known, for example.

However, a conventional waterproofing structure of the electrical junction box is made for automotive vehicle operation, and therefore, such a waterproofing structure is not effective in an unexpected situation in which water infiltrates the electrical junction box due to tsunami, flood, or the like in a case of a disaster such as the Great East Japan Earthquake. Many instances have been reported in which the electrical junction box located near the battery in the vehicle caught fire after the unexpected infiltration of water, causing vehicle fire, which has been regarded as a problem.

It is necessary to urgently develop some measure for preventing the electrical junction box from catching fire after such unexpected infiltration of water. However, providing the electrical junction box with a waterproofing structure that is made to withstand a case of the infiltration of water due to tsunami, flood, or the like has risks of not only leading an increase in the size and the cost of the electrical junction box but also impairing the functions of the electrical junction box during normal use of the vehicle, and therefore, it is difficult to say that such a measure is practical. Accordingly, there has been the demand for an effective measure capable of preventing the electrical junction box after the infiltration of water from catching fire.

The present invention has been achieved in light of the above-described circumstances, and the problem to be solved of the present invention is to provide an electrical junction box having a novel structure capable of preventing vehicle fire after the infiltration of water without depending on a waterproofing structure of the electrical junction box.

As a result of intensive research by the inventors of the present invention on a cause of fire after the infiltration of water into a vehicle, it was found that particularly in an electrical junction box that is directly connected to a battery, fires broke out in a part where a power source-side bus bar made of copper that was connected to a power source line and a ground-side bus bar made of copper that was connected to a ground line were arranged adjacent to each other. That is, when water containing electrolytes, such as salt water, infiltrates a vehicle, electrolysis occurs between the power source-side bus bar and the ground-side bus bar having a relatively large potential difference therebetween, and thus cuprous oxide ($Cu_2O$), which is an oxide of copper, is precipitated on the anode. When the water recedes, the precipitated cuprous oxide is deposited between the power source-side bus bar and the ground-side bus bar, and thus a short-circuit path made of a deposition of the cuprous oxide is formed between the two bus bars. When current continues to be conducted from the battery even after the infiltration of water, and the temperature rises to some extent, the resistance of the cuprous oxide decreases, and thus a short circuit occurs. It was newly found that the insulated board burned due to the heat at that time, thus causing a fire. The present invention was achieved based on the new findings.

SUMMARY OF THE INVENTION

A first aspect of the present invention is an electrical junction box including a bus bar circuit unit in which a plurality of bus bars are arranged on an insulated board, the plurality of bus bars including a power source-side bus bar to be connected to a power source line and a ground-side bus bar to be connected to a ground line, wherein the power source-side bus bar and the ground-side bus bar are arranged adjacent to each other, and an oxide deposition inhibiting structure is provided in an exposed portion of the insulated board that is exposed through a gap between the power source-side bus bar and the ground-side bus bar.

With this aspect, the oxide deposition inhibiting structure is provided in the exposed portion of the insulated board exposed through the gap between the power source-side bus bar and the ground-side bus bar, which are arranged adjacent to each other on the insulated board. Therefore, even if water infiltrates a vehicle due to tsunami, flood, or the like, and electrolysis occurs between the adjacently arranged power source-side bus bar and ground-side bus bar having a large potential difference therebetween, so that an oxide, namely cuprous oxide, is generated, the oxide deposition inhibiting structure for inhibiting the deposition of the oxide is provided in the gap between the two bus bars. Accordingly, it is possible to prevent the deposition of the oxide between the adjacently arranged power source-side bus bar and ground-side bus bar, and to prevent the formation of a short-circuit path made of the deposited oxide to prevent short circuit and the breakout of a fire due to the short circuit. Therefore, it is possible to prevent the electrical junction box from catching fire with a simple structure in a case of the infiltration of water without depending on a waterproofing structure of the electrical junction box.

It should be noted that the power source-side bus bar does not necessarily have to be a bus bar to be directly connected to a positive terminal of the battery serving as a power source line but may also be a bus bar to be indirectly connected thereto via another member. Moreover, the ground-side bus bar does not necessarily have to be a bus bar to be directly connected to a negative terminal of the battery serving as a ground line but may also be a bus bar to be indirectly connected thereto via another member. In short, the power source-side bus bar and the ground-side bus bar are constituted by two bus bars that are arranged adjacent to each other and have a potential difference therebetween.

A second aspect of the present invention is the electrical junction box according to the first aspect, wherein the oxide deposition inhibiting structure is formed by cutting out the exposed portion.

With this aspect, the oxide deposition inhibiting structure is configured by cutting out the exposed portion of the insulated board exposed through the gap between the power source-side bus bar and the ground-side bus bar. Accordingly, even if cuprous oxide is precipitated in a case of the infiltration of water into a vehicle, a portion of the insulated board located in the gap between the power source-side bus bar and the ground-side bus bar is cut out, and therefore, the deposition of the cuprous oxide on the portion of the insulated board located in the gap is more reliably prevented. Therefore, it is possible to advantageously prevent short circuit due to the deposited oxide and the breakout of a fire due to the short circuit.

A third aspect of the present invention is the electrical junction box according to the second aspect, wherein the oxide deposition inhibiting structure is formed by cutting out not only the exposed portion but also a bus bar supporting portion that links to the exposed portion and supports at least one of the power source-side bus bar and the ground-side bus bar.

With this aspect, the oxide deposition inhibiting structure is configured by cutting out not only the exposed portion of the insulated board exposed through the gap between the power source-side bus bar and the ground-side bus bar but also the bus bar supporting portion, which links to the exposed portion and supports at least one of the power source-side bus bar and the ground-side bus bar. Accordingly, even if cuprous oxide is precipitated in a case of the infiltration of water into a vehicle, the exposed portion of the insulated board is cut out, and thus the deposition of the cuprous oxide is prevented. In addition, the bus bar supporting portion of the insulated board linking to the exposed portion is cut out. Therefore, even if a short circuit occurs due to the deposited oxide, a portion of the insulated board, which catches fire due to the short circuit, is cut out, and as a result, it is possible to advantageously prevent the breakout of a fire.

A fourth aspect of the present invention is the electrical junction box according to the first aspect, wherein the oxide deposition inhibiting structure is formed by providing a plurality of through holes in the exposed portion.

With this aspect, the oxide deposition inhibiting structure is configured by providing the through holes in the exposed portion of the insulated board exposed through the gap between the power source-side bus bar and the ground-side bus bar. Accordingly, even if cuprous oxide is precipitated in a case of the infiltration of water into a vehicle, the oxide falls through the through holes, and thus the deposition of the oxide in the gap between the power source-side bus bar and the ground-side bus bar is inhibited. Therefore, it is possible to advantageously prevent short circuit due to the deposited oxide and the breakout of a fire due to the short circuit. In particular, providing the through holes in the exposed portion of the insulated board makes it possible to inhibit the deposition of the oxide while ensuring the strength and bus bar retainability of the insulated board compared with the case where the exposed portion is completely cut out.

A fifth aspect of the present invention is the electrical junction box according to the fourth aspect, wherein the insulated board is made of a resin plate mesh, and the through holes are constituted by loops of the mesh.

With this aspect, the entire insulated board can be made of the resin plate mesh, thus making it possible to provide the oxide deposition inhibiting structure on the insulated board with better production efficiency compared with the case where the oxide deposition inhibiting structure is separately formed on only the exposed portion exposed through the gap between the power source-side bus bar and the ground-side bus bar.

With the present invention, the oxide deposition inhibiting structure is provided in the exposed portion of the insulated board exposed through the gap between the power source-side bus bar and the ground-side bus bar, which are arranged adjacent to each other on the insulated board. Therefore, even if water infiltrates a vehicle due to tsunami, flood, or the like and electrolysis occurs between the power source-side bus bar and the ground-side bus bar to generate cuprous oxide, it is possible to prevent the deposition of the oxide between the power source-side bus bar and the ground-side bus bar, and to inhibit the formation of a short-circuit path made of the deposited oxide to prevent a short circuit and the breakout of a fire due to the short circuit. Accordingly, it is possible to prevent the electrical junction box from catching fire with a simple structure in a case of the infiltration of water without depending on a waterproofing structure of the electrical junction box.

DETAILED DESCRIPTION OF THE PREFERRED EMBODIMENTS

Hereinafter, embodiments of the present invention will be described with reference to the drawings.

Figure 1:
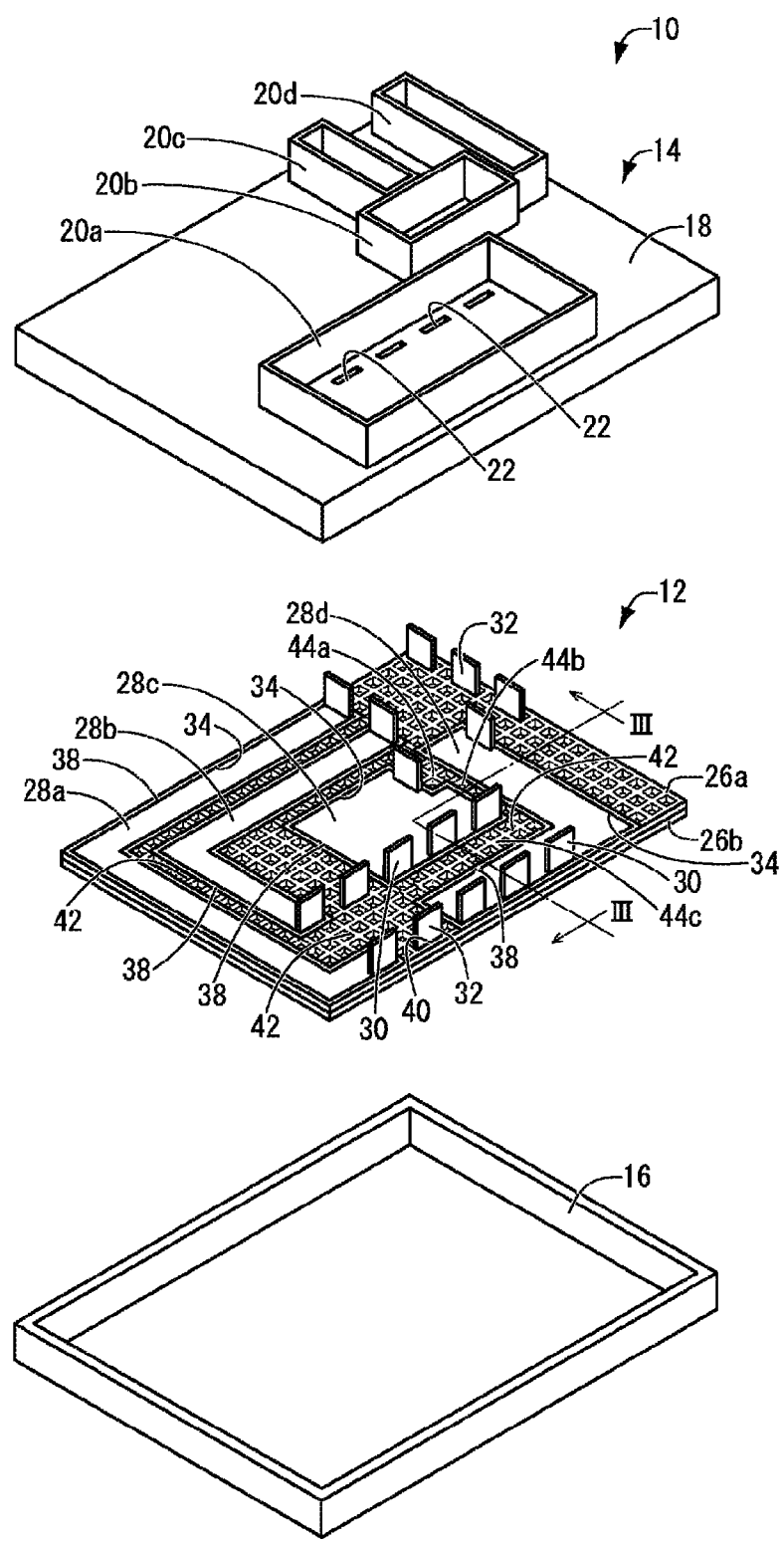
FIG. 1 is an exploded perspective view of an electrical junction box according to an embodiment of the present invention.
Figure 2:
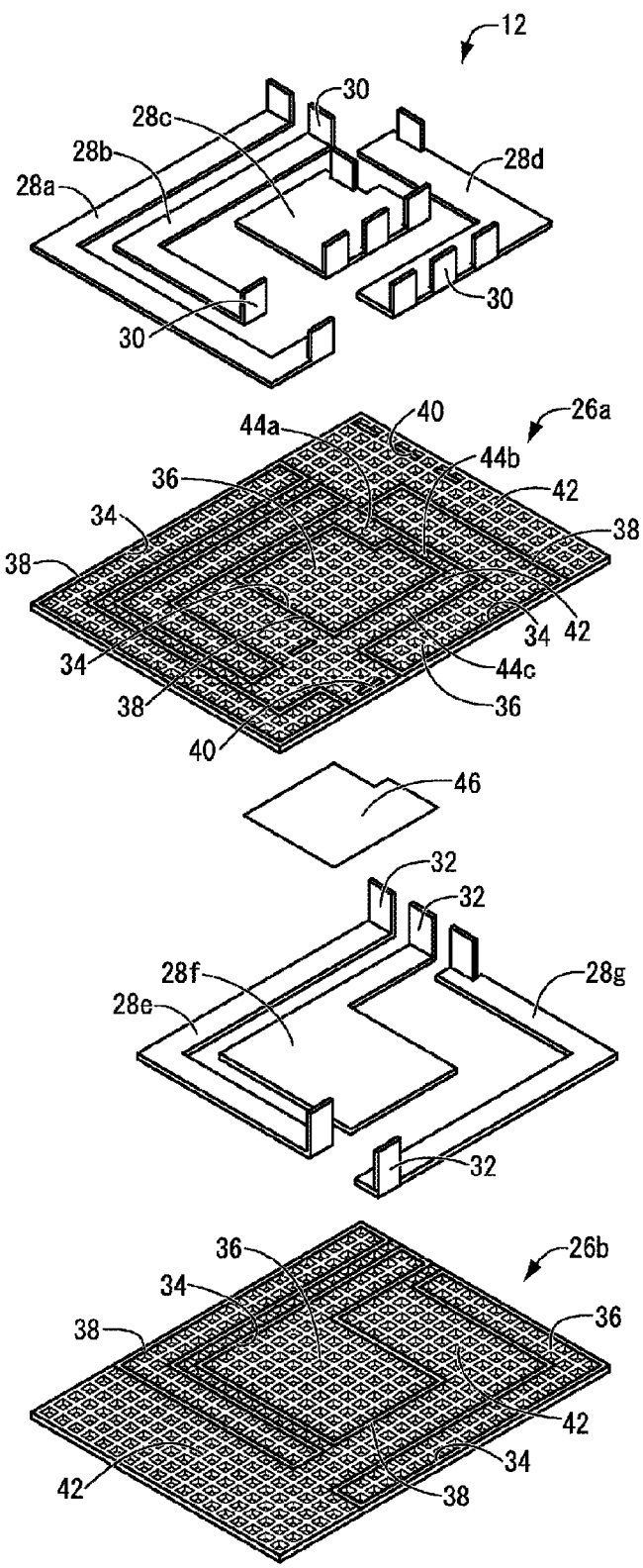
FIG. 2 is an exploded perspective view of a bus bar circuit unit shown in FIG. 1.
Figure 3:
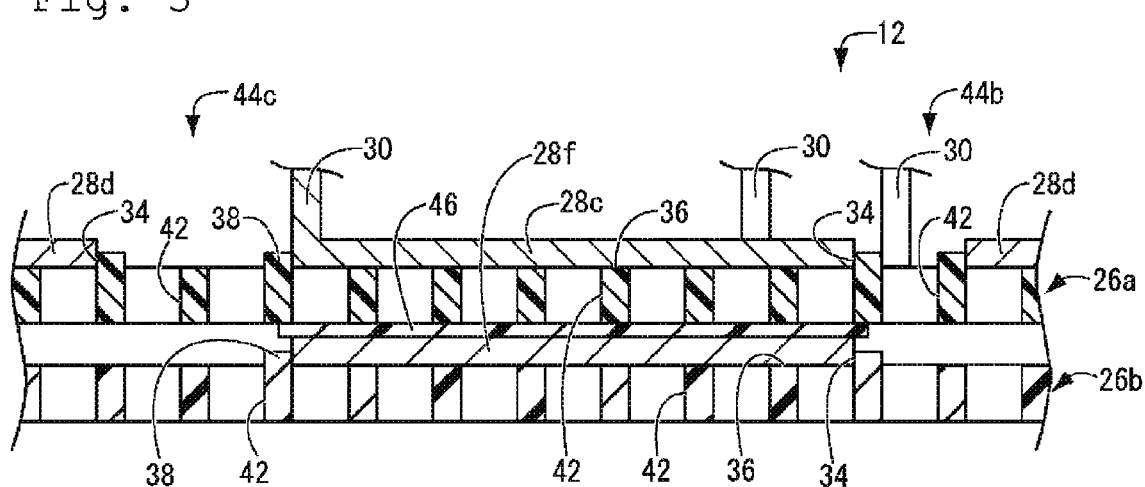
FIG. 3 is an enlarged view of main portions in a cross section taken along line III-III in FIG. 1.

First, FIGS. 1 to 3 show an electrical junction box 10 according to an embodiment of the present invention. As shown in FIG. 1, the electrical junction box 10 includes a bus bar circuit unit 12 that constitutes an internal circuit, an upper case 14, and a lower case 16. The upper case 14 and the lower case 16 are stacked on and assembled to the bus bar circuit unit 12 onto both sides of the bus bar circuit unit 12, and thus the electrical junction box 10 is provided with a configuration in which the bus bar circuit unit 12 is accommodated within the cases 14, 16. It should be noted that the bus bar circuit unit 12 is secured to the cases 14, 16 using a known securing means such as bolts (not shown). Moreover, in the following description, unless otherwise stated, "upper side" refers to the upper side in FIG. 1 where the upper case 14 is located, and "lower side" refers to the lower side in FIG. 1 where the lower case 16 is located.

As shown in FIG. 1, the upper case 14 and the lower case 16 are made of a synthetic resin, and have a shallow box shape that is open toward the mating case side and has a substantially rectangular bottom. The upper case 14 and the lower case 16 are assembled to each other by locking claws (not shown) provided on the upper case 14 being inserted through and engaged with engaging frames (not shown) provided at the corresponding position of the lower case 16. Moreover, bracket attaching portions (not shown) are provided at appropriate positions that are separated from each other on a peripheral wall of the upper case 14 or the lower case 16. Brackets (not shown) provided on a vehicle body side are attached thereto, and thus the electrical junction box 10 is attached and fixed at an appropriate position in an engine room or the like of the vehicle.

Moreover, as shown in FIG. 1, a plurality of connector accommodating portions 20a to 20d that each include a peripheral wall projecting upward from the upper case 14 are provided on an upper surface 18 of the upper case 14. Bus bar terminals 30 and 32 provided on end portions of bus bars 28a to 28g, which will be described later, project upward from the upper case 14 through terminal inserting holes 22 formed in bottom walls of the connector accommodating portions 20a to 20d. It should be noted that the bus bar terminals 30 and 32 are divided into groups that each include an appropriate combination of the terminals, and are arranged in the connector accommodating portions 20a to 20d.

External connectors that are provided at the end portions of electric wires included in an external electric circuit (not shown) can be inserted into the connector accommodating portions 20a to 20d. When these external connectors are inserted therein, the electric wires included in the external electric circuit are connected to the bus bar terminals 30 and 32 projecting into the connector accommodating portions 20a to 20d.

On the other hand, as shown in FIG. 2, the bus bar circuit unit 12 has a stacked structure in which the bus bars 28a to 28g are stacked on and supported by the surfaces of insulated boards 26a and 26b having a substantially thin flat plate shape. That is, bus bar fitting grooves 34 having shapes corresponding to the bus bars 28a to 28g, which are stacked and supported, are formed in the surfaces of the insulated boards 26a and 26b, and the bus bars 28a to 28g are fitted to these bus bar fitting grooves 34 and supported thereby. Accordingly, the bus bars 28a to 28g are mounted on arrangement surfaces 36, which are the bottom surfaces of the bus bar fitting grooves 34, on the surfaces of the insulated boards 26a and 26b, and are assembled thereto in a positioned state. It should be noted that in this embodiment, the bus bar fitting grooves 34 each have a structure in which projecting ribs 38 around the bus bar fitting groove 34 form a peripheral wall.

Each of the bus bars 28a to 28g is a plate formed by punching a conductive metal plate, or the like, and is provided with the bus bar terminals 30 and 32 at appropriate positions of its edge portions. These bus bar terminals 30 and 32 are formed by being bent at a substantially right angle on the insulated boards 26a and 26b so as to extend upward. It should be noted that base end portions of the bus bar terminals 30 and 32 are supported by bottom wall portions of the bus bar fitting grooves 34 formed in the insulated boards 26a and 26b.

The bus bar terminals 32 of the bus bars 28e to 28g mounted on the lower insulated board 26b are inserted through a plurality of through holes 40 formed in the upper insulated board 26a, and project upward at a substantially right angle from the surface of the upper insulated board 26a in the same manner as the bus bar terminals 30 of the bus bars 28a to 28d mounted on the upper insulated board 26a.

On the other hand, the insulated boards 26a and 26b are made of a synthetic resin and have a mesh structure. Specifically, both the insulated boards 26a and 26b are substantially rectangular, and the mesh structure is formed by providing through holes 42 that penetrate the insulated boards 26a and 26b over the entire insulated boards 26a and 26b with predetermined pitches in both the longitudinal direction and the lateral direction. In other words, the through holes 42 are constituted by loops constituting the mesh structure.

In this embodiment, for example, the bus bar 28c serves as a power source-side bus bar to be connected to a power source line, whereas the bus bars 28d and 28f serve as ground-side bus bars to be connected to ground lines. Here, "power source-side bus bar" means not only a bus bar to be directly connected to a positive terminal of a battery serving as the power source line but can also be a bus bar to be indirectly connected thereto via another member. Moreover, "ground-side bus bar" means not only a bus bar to be directly connected to a negative terminal of a battery serving as a ground line but can also be a bus bar to be indirectly connected thereto via another member. In short, the power source-side bus bar and the ground-side bus bar are constituted by two bus bars that are arranged adjacent to each other and have a potential difference therebetween. For example, instead of a bus bar to which a voltage of 12 V is applied, the power source-side bus bar can also be a bus bar to which a voltage of 24 V or 48 V is applied or a bus bar to which a voltage of 12 V or less is applied. Moreover, instead of a bus bar to which a voltage of 0 V is applied, the ground-side bus bar can also be a bus bar to which a voltage of 0 V or more is applied, which is lower than the voltage applied to the power source-side bus bar. In this embodiment, a voltage of 12 V is applied to the power source-side bus bar 28c, and a voltage of 0 V is applied to the ground-side bus bars 28d and 28f.

As shown in FIGS. 1 to 3, the power source-side bus bar 28c and the ground-side bus bar 28d are arranged adjacent to each other, and the through holes 42 penetrate exposed portions 44a to 44c of the insulated board 26a exposed through the gap between the power source-side bus bar 28c and the ground-side bus bar 28d. Therefore, even if water infiltrates a vehicle due to tsunami, flood, or the like, and electrolysis occurs between the adjacently arranged power source-side bus bar 28c and ground-side bus bar 28d having a large potential difference, so that an oxide, namely cuprous oxide, is generated, the oxide falls through the through holes 42, and thus oxide is not deposited in the gap between the power source-side bus bar 28c and the ground-side bus bar 28d. Accordingly, it is possible to advantageously prevent a short circuit due to the cuprous oxide, which is the deposited oxide, and the breakout of a fire due to the short circuit. As a result, it is possible to prevent the electrical junction box 10 from catching fire with a simple structure in a case of the infiltration of water without depending on a waterproofing structure of the electrical junction box 10.

Furthermore, by taking a measure in which the through holes 42 are provided in the exposed portions 44a to 44c of the insulated board 26a, it is possible to inhibit the deposition of the oxide while ensuring the strength and retainability for the bus bar 28c compared with the case where the exposed portions 44a to 44c of the insulated board 26a are completely cut out. In this embodiment, in this manner, the oxide deposition inhibiting structure is constituted by the through holes 42 penetrating the exposed portions 44a to 44c of the insulated board 26a.

Moreover, with this embodiment, the entire insulated board 26a is made of a resin plate mesh, thus making it possible to provide the through holes 42 serving as the oxide deposition inhibiting structure in the insulated board 26a with better production efficiency compared with the case where the through holes 42 are separately formed only in the exposed portions 44a to 44c of the insulated board 26a exposed through the gap between the power source-side bus bar 28c and the ground-side bus bar 28d. Furthermore, since the entire lower insulated board 26b is also made of the resin plate mesh, it is possible to cause the oxide falling from the exposed portions 44a to 44c of the upper insulated board 26a to further fall through the through holes 42 of the lower insulated board 26b, thus making it possible to advantageously prevent the occurrence of a short circuit between the lower bus bars 28e to 28g due to the oxide.

As shown in FIG. 2 and FIG. 3, a sheet 46 for covering the mesh is arranged between the insulated board 26a and the ground-side bus bar 28f in the part where the power source-side bus bar 28c and the ground-side bus bar 28f are vertically stacked with the mesh insulated board 26a being sandwiched therebetween. Accordingly, a short circuit in the vertical stacking part due to the deposition of the oxide after the infiltration of water, and the breakout of a fire due to the short circuit are prevented. It should be noted that the sheet 46 is made of an insulating sheet material, such as a synthetic resin.

Figure 4:
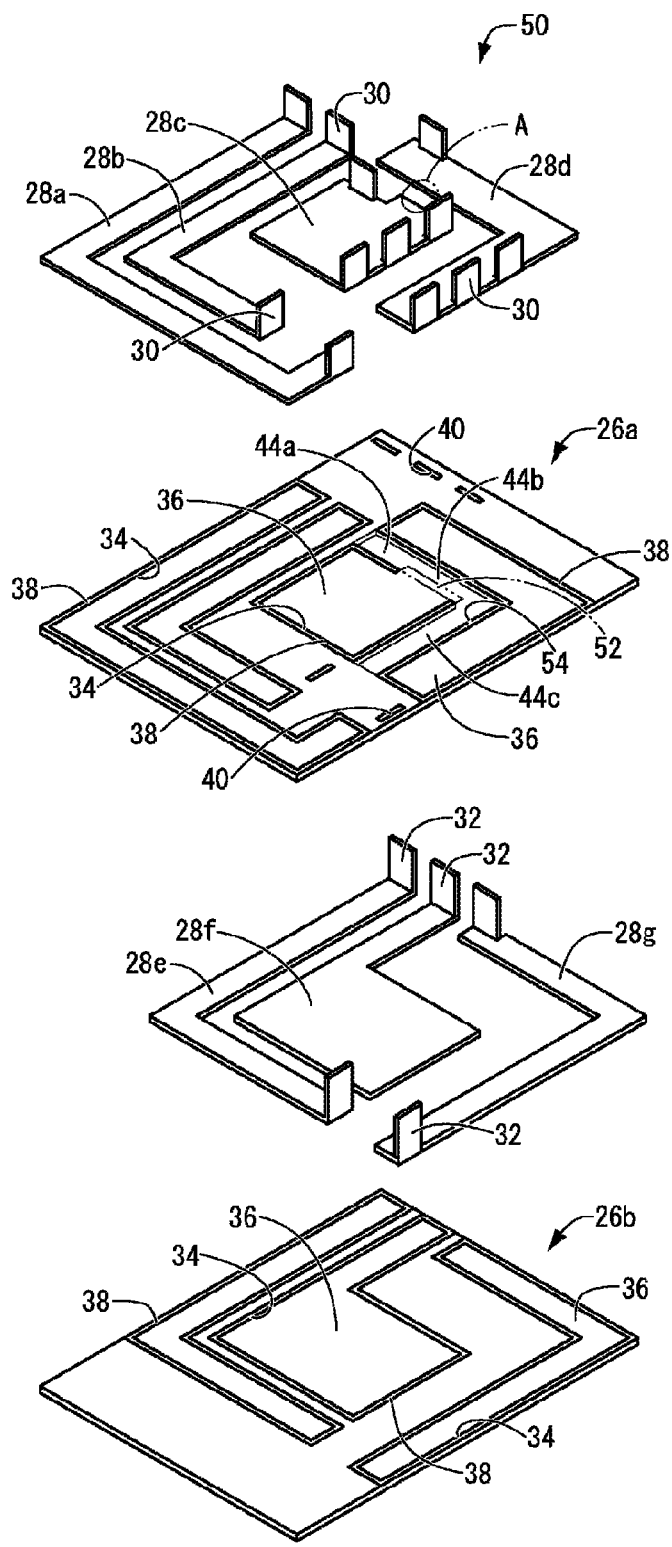
FIG. 4 is an exploded perspective view of another embodiment of an oxide deposition inhibiting structure to be used in the electrical junction box according to the present invention, and corresponds to FIG. 2.

Next, another embodiment of the oxide deposition inhibiting structure used in the bus bar circuit unit 12 of the electrical junction box 10 according to the present invention will be described in detail with reference to FIG. 4. Members and parts having a structure similar to those of the members and parts of the above embodiment are denoted in the drawings by the same reference numerals as in the above embodiment, and thus their description will be omitted. That is, a bus bar circuit unit 50 is an embodiment that is different from the above embodiment in that insulated boards 26a and 26b are formed into a flat plate shape without through holes 42, and the oxide deposition inhibiting structure is formed by cutting out exposed portions 44a to 44c of the upper insulated board 26a. Since the exposed portions 44a to 44c of the upper insulated board 26a are cut out in the bus bar circuit unit 50, it is possible to more reliably prevent the deposition of cuprous oxide at the exposed portions 44a to 44c of the insulated board 26a exposed through the gap between a power source-side bus bar 28c and a ground-side bus bar 28d. Therefore, it is possible to advantageously prevent a short circuit due to the deposited oxide and the breakout of a fire due to the short circuit.

Furthermore, in this embodiment, the oxide deposition inhibiting structure is constituted by a cut-out portion 54 obtained by cutting out not only the exposed portions 44a to 44c but also a bus bar supporting portion 52 (a portion indicated by a virtual line in FIG. 4) that links to the exposed portions 44a to 44c and supports the power source-side bus bar 28c in region A that is the narrowest region in the gap between the power source-side bus bar 28c and the ground-side bus bar 28d. Accordingly, even if a short circuit due to the deposited oxide occurs, the bus bar supporting portion 52, that is highly likely to burn due to the heat generated at that time, is cut out, thus making it possible to advantageously prevent the breakout of a fire due to the short circuit.

Although the embodiments according to the present invention have been described in detail, the present invention is not limited to the specific description. For example, although the through holes 42 also penetrate portions other than the exposed portions 44a to 44c of the insulated board 26a in the first embodiment, it is sufficient if the through holes 42 are provided in at least the exposed portions 44a to 44c of the insulated board 26a. Therefore, the through holes 42 need not be provided in the lower insulated board 26b. Moreover, the shape, the number, and the pitches of the through holes penetrating the exposed portions 44a to 44c of the upper insulated board 26a can be set as desired.

Instead of providing the sheet 46, no through holes 42 may be provided in the upper insulated board 26a at the location where the sheet 46 is to be provided.

In addition, although an example in which the oxide deposition inhibiting structure was provided by cutting out the exposed portions 44a to 44c of the insulated board 26a having a flat plate shape was shown in the second embodiment, the oxide deposition inhibiting structure can also be configured by further cutting out the exposed portions 44a to 44c in the mesh insulated board 26a shown in the first embodiment. Moreover, although the oxide deposition inhibiting structure constituted by the cut-out portion 54 in which the bus bar supporting portion 52, which links to the exposed portions 44a to 44c and supports the power source-side bus bar 28c, was additionally cut out was shown as an example in the second embodiment, a bus bar supporting portion for supporting the ground-side bus bar 28d may be cut out instead of or in addition to the bus bar supporting portion 52.

The invention claimed is:

1. An electrical junction box comprising a bus bar circuit unit in which a plurality of bus bars are arranged on an insulated board, the plurality of bus bars including a power source-side bus bar to be connected to a power source line and a ground-side bus bar to be connected to a ground line,
wherein the power source-side bus bar and the ground-side bus bar are arranged adjacent to each other, and
an oxide deposition inhibiting structure is provided in an exposed portion of the insulated board, the oxide deposition inhibiting structure defines a pair of through holes on each side of the oxide deposition inhibiting structure, wherein the through holes penetrate the exposed portions of the insulated board between the power source-side bus bar and the ground-side bus bar so as to allow oxide to fall through the through-hole.

2. The electrical junction box according to claim 1, wherein the oxide deposition inhibiting structure is formed by cutting out the exposed portion.

3. The electrical junction box according to claim 2, wherein the oxide deposition inhibiting structure is formed by cutting out not only the exposed portion but also a bus bar supporting portion that links to the exposed portion and supports at least one of the power source-side bus bar and the ground-side bus bar.

4. The electrical junction box according to claim 1, wherein the oxide deposition inhibiting structure is a plurality of oxide deposition inhibiting structures formed by providing a plurality of through holes in the exposed portion.

5. The electrical junction box according to claim 4, wherein the insulated board is made of a resin plate mesh, and the mesh having a plurality of loops so as to form the through holes.

* * * * *